United States Patent [19]

Horvath

[11] 4,415,025

[45] Nov. 15, 1983

[54] THERMAL CONDUCTION ELEMENT FOR SEMICONDUCTOR DEVICES

[75] Inventor: Joseph L. Horvath, Poughkeepsie, N.Y.

[73] Assignee: International Business Machines Corporation, Armonk, N.Y.

[21] Appl. No.: 291,218

[22] Filed: Aug. 10, 1981

[51] Int. Cl.³ .......................................... H01L 23/36
[52] U.S. Cl. ............................. 165/185; 174/16 HS; 361/386
[58] Field of Search ....................... 165/185 R, 185 A; 361/386; 174/16 HS; 267/161

[56] References Cited

U.S. PATENT DOCUMENTS

| | | | |
|---|---|---|---|
| 404,284 | 5/1889 | Johnson | 267/161 X |
| 3,195,628 | 7/1965 | McAdam | 165/185 |
| 3,237,739 | 3/1966 | Pritchard | 267/161 X |
| 3,387,191 | 6/1968 | Fishman et al. | 165/185 |
| 3,412,788 | 11/1968 | Pomerantz | 165/185 |
| 3,503,441 | 3/1970 | Sarnezki | 165/185 |
| 3,536,892 | 10/1970 | Walther et al. | 165/185 X |
| 4,156,458 | 5/1979 | Chu et al. | 165/185 X |
| 4,190,106 | 2/1980 | Dunmire et al. | 165/185 |

OTHER PUBLICATIONS

Kunkler et al., Module with Removable Heat Transfer Members, IBM Technical Disclosure Bulletin, vol. 23, No. 9, pp. 4095-4096, Feb. 1981.
Zirnis, Semiconductor Module with Improved Air Cooling, IBM TDB, vol. 20, No. 5, p. 1768, Oct. 1977.
Goodman, Intramodular Thermal Shunt, IBM TDB, vol. 21, No. 3, pp. 1141-1142, Aug. 1978.

Primary Examiner—Sheldon J. Richter
Attorney, Agent, or Firm—Wolmar J. Stoffel

[57] ABSTRACT

A disk shaped thermal bridge element for use in a semiconductor package to conduct heat from a device to a cold plate, which disk element has a bulged shape with a first set of inwardly extending slots and a second set of outwardly extending slots emanating from the center of the disk.

15 Claims, 5 Drawing Figures

THERMAL CONDUCTION ELEMENT FOR SEMICONDUCTOR DEVICES

TECHNICAL FIELD

My invention relates to techniques and structure for the dissipation of thermal energy generated by semiconductor devices. More particularly, the present invention relates to conduction elements for cooling semiconductor devices in single device or multi-device integrated circuit package assemblies where the devices are mounted on substrates with solder bonds, and the heat sinks or covers are mounted in close proximity to the back sides of the devices.

The high circuit densities in modern integrated circuit semiconductor devices require that the heat generated by their operation be efficiently removed in order to maintain the temperature of the devices within limits that will keep the operating parameters of the devices within pre-determined ranges, and also prevent destruction of the device by overheating. The problems associated with heat removal are increased when the device is connected to the supporting substrate with solder terminals that electrically connect the device to appropriate terminals on the substrate. On such solder bonded devices, the heat transfer that can be accomplished through the solder bonds is limited, as compared to back bonded devices. Cooling of the semiconductor devices can be achieved by immersing the devices in a suitable liquid coolant. However, these cooling techniques can result in corrosion of the device and substrate metallurgy and also present problems if the package must be reworked. Cooling can also be achieved by providing a heat conductive link of material, such as cooling pistons or spring elements, between the device and the cap or cold plate. These elements must be capable of consistently forming and maintaining a good interface contact between the element and device and cooling plate over as large an area as possible in order to maintain a low thermal resistance. With cooling pistons, forming and maintaining such interface contact is difficult because the devices may be tilted, resulting in an unsatisfactory point or line contact. In general, cooling pistons must be used in an atmosphere of inert gasses with higher heat conductivity than air, or a grease or other conformal means be provided at the piston end-device interface. Another disadvantage is that the pistons may subject the devices being cooled to shock when the package is subjected to inertial forces. Spring elements for thermal conduction between a device and cold plate are known. A prevalent problem is designing sufficiently heavy springs that will efficiently conduct heat and accommodate for spacing tolerances and yet not impose forces on the devices that will crack or chip them. The consideration becomes more severe as the tolerance of the gap between the device and cap are increased. In general, the known spring elements when made heavy enough to efficiently conduct heat become too stiff to accommodate for spacing variations without imposing potentially damaging stresses on the devices. Conversely, when the spring elements are made sufficiently thin and flexible to accommodate for spacing tolerances, the reduced thickness will not have the capability of transferring heat away from the device to meet the cooling requirements.

BACKGROUND ART

The following prior art references relate to various structures for removing heat from solder bonded semiconductor devices. U.S. Pat. No. 3,993,123 discloses a semiconductor package in which a movable heat conductive piston is placed in contact with the back side of a solder bonded semiconductor device to conduct heat away from the device to a cooling plate. U.S. Pat. Nos. 4,034,468 and 4,081,825 both disclose semiconductor packages wherein a low melting point solder is provided in contact with the back side of a solder bonded device and with the module cap to remove heat from the device. U.S. Pat. No. 4,156,458 discloses a cooling arrangement including a flexible heat conductive metallic foil bundle extending between the back side of a device and the heat sink. IBM Technical Disclosure Bulletin Vol. 21 No. 3 Aug. 1978 P. 1141 discloses a thermal shunt element disposed between a solder bonded semiconductor device and a module cap comprised of a rectangular center portion and a pair of divergent wings that contact the cap. IBM TDB Vol. 20 No. 6 Nov. 1977 P. 2214 and U.S. Pat. No. 4,156,458 issued May 29, 1979 disclose a plurality of preform sheets of aluminum foil nested together and disposed between solder bonded semiconductor devices and a housing to remove heat from the devices. IBM TDB Vol. 19 No. 12 May 1977 P. 4683 discloses a thermal conduction bridge element between a solder bonded semiconductor device and a cap which features a plurality of interleaved relatively slidable fins. Application Ser. No. 249,262, filed Mar. 30, 1981, assigned to the same assignee as this application, discloses a thermal bridge for conducting heat from a device to the cover which includes a relatively thick metal sheet provided with cuts that define at least one tab element.

The invention is an improved cooling element adapted to be positioned between a solder bonded semiconductor device and a module cap or cold plate to form a heat conduction bridge between the device and cap or cold plate. The thermal bridge element is a bulged disk of resilient heat conductive material, typically a copper or silver alloy containing a small amount of material to make the material more spring-like, the disk provided with a first plurality of spaced radial slots emanating from a common central point and terminating short of the outside edge, a second plurality of spaced radial slots located between the first plurality of radial slots in alternating relation and extending from the edge inwardly terminating short of the center of the disk. The disk is preferably provided with a low melting coating such as lead, tin, indium or a low melting solder. The combination of inwardly and outwardly radiating slots permits the use of a much thicker disk, capable of effectively and efficiently conducting heat while yet retaining the ability to flex without imposing destructive stresses on the device.

BRIEF DESCRIPTION OF THE DRAWINGS

The details of my invention will be described in connection with the accompanying drawing in which.

DISCLOSURE OF THE PREFERRED EMBODIMENT

Figure 1:
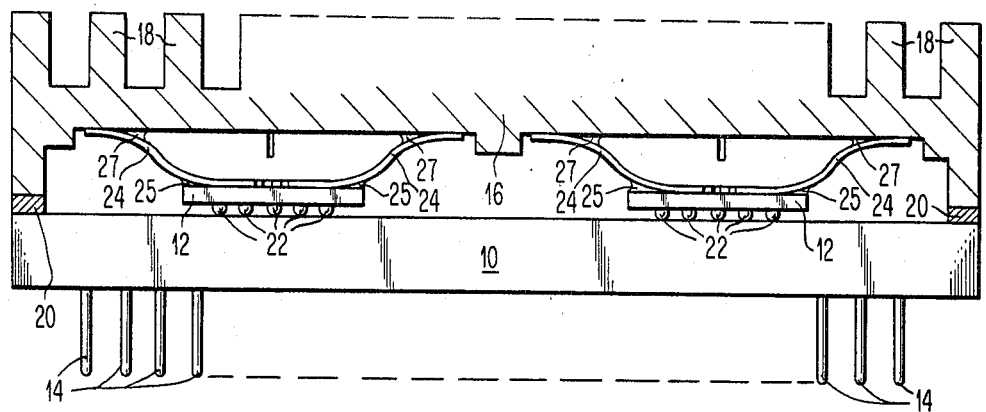
FIG. 1 is an elevational view in section, and in greatly enlarged scale, illustrating a semiconductor package and the thermal bridge element of the invention as used therein.
Figure 2:
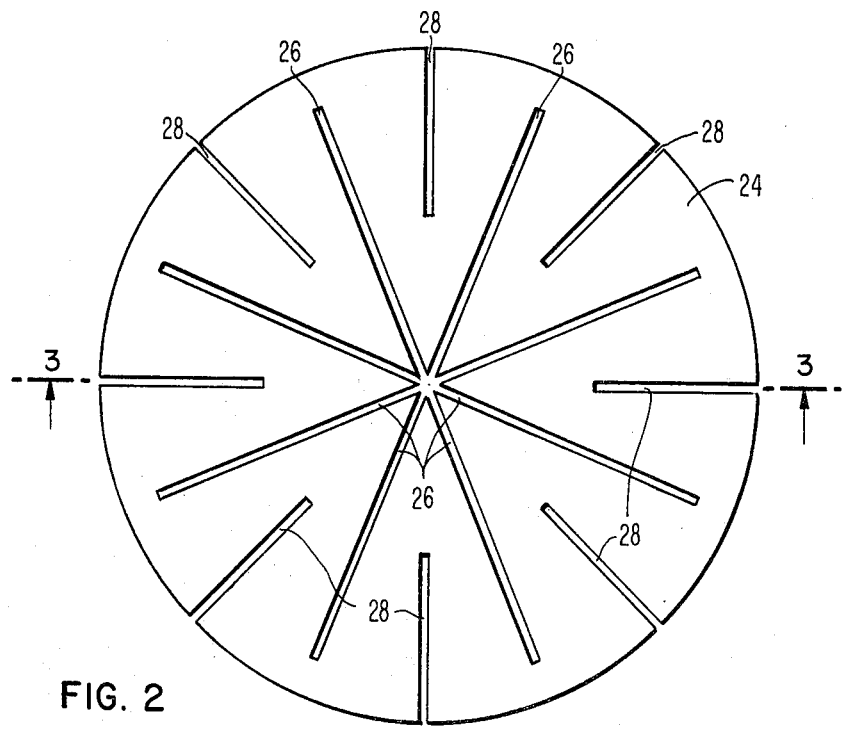
FIG. 2 is a top view of the bridge element of my invention in greatly enlarged scale.

Referring now to the drawings, and FIG. 1 in particular, there is illustrated a semiconductor package made up of a substrate 10 with a metallurgy pattern within or on the top surface of the substrate that interconnects devices 12 mounted thereon and pins 14 extending from the bottom surface. A typical finned cap 16 provided with fins 18 is secured to substrate 10 by a braze seal 20. The devices 12 are electrically connected to the metallurgy system on or within substrate 10 by solder interconnections 22. In operation, the devices 12 generate heat which must be dissipated by heat conduction through solder bonds 22, and preferably some type sort of thermal interconnection to conduct heat from the back side of the device to the cap or heat sink. In this invention, the heat is removed from the device to the overlying cap 16 by thermal bridge elements 24. Thermal element 24 is illustrated more clearly in FIGS. 2 and 3 where it is shown in greatly enlarged scale. Element 24 is basically a bulged disk made of a heat conductive material, typically a metal or alloy, preferably an alloy in which copper or silver is the major constituent. A preferred alloy is zirconium-copper with copper present in an amount of 99.85% and 0.15% zirconium. Another preferred alloy is composed of 99.75% Cu and the remainder of Ag, P and mg. In general, the metal should be composed of at least 25–30% copper or silver in order to maintain the desirable high thermal conductivity. As indicated in FIG. 2 the disk is shown with a circular periphery. Alternatively, the disk could have a polygon shape. Element 24 has two sets of slots that gives it great flexibility allowing the use of a relatively heavy thick sheet providing the capability of transferring a large amount of heat. A first set of spaced radial slots 26 emanate from a common central point terminating short of the outside edge. A second set of spaced radial slots 28 arranged in alternating relation to slots 26 extend inwardly from the outside edge of the element 24 terminating short of the center of the disk. The number of slots and the length relative to the diameter of the element is dictated by the thickness of the disk and also the permissible force that can be exerted on semiconductor 12. In general, the width of slots 26 and 28 is in the range of 4 to 18 mils. The slots 26 can be of any suitable length, however, the preferred length is approximately 90% of the radius of the disk. Slots 28 are preferably from 70 to 80% of the length of the radius of the disk. The bulged disk elements 24 can be produced by any suitable technique. A useful technique for producing the elements is providing a masking coating, on a selected sheet of material, exposing the coating to define the pattern of the slots, developing the resist, and etching away the exposed area of the slots. Alternately, the disks can be produced by stamping the elements with a suitable dye. After the slots 26 and 28 have been formed, the disk elements are shaped to provide a cross-sectional shape illustrated generally in FIG. 3 of the drawings. In use, heat must be transferred from the device to the cover or cold plate across a gap, indicated in FIG. 3 by arrows 30. This distance, characterized as a gap, will vary in length depending on the tolerances inherent in fabricating a semiconductor package. Element 24 must be capable of bridging the variable gap encountered in the package, and also accommodate for tilting of the chip which occurs when the solder connections 22 are not uniform, or warpage occurs in the substrate 10. The element 24 is preferably shaped so that it has the cross-section illustrated in FIG. 3. The gap between the device 12 and cover 16 is exaggerated in the drawings in order to better illustrate the desired shape. This cross-section can be defined by providing by shaping the outer annular edge to a curvature of a radius R1, and the inner central portion with an opposite curvature with a radius defined as R2. R1 and R2 can be any suitable radius depending on the gap distance, the thickness of element 24, the length of slots 26 and 28, diameter of disk, etc. Preferably, the radius of R1 is in the range of 25 to 100% of the diameter of the disk, and the radius R2 is in the range of 25 to 100% of the diameter of the disk.

Figure 3:
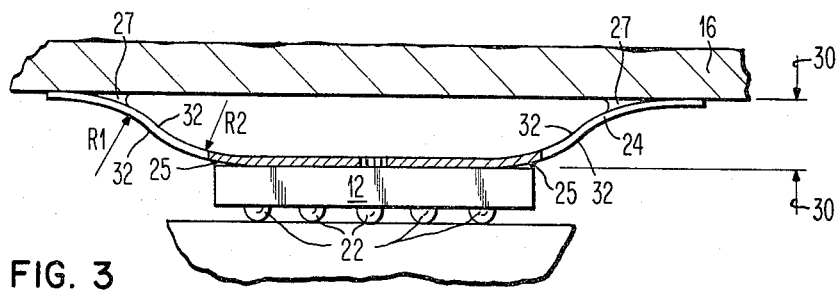
FIG. 3 is a cross-sectional view of the bridge element illustrated in FIG. 2 taken on line 3—3 and illustrating its relationship between a cold plate and a solder bonded semiconductor device.

In order to improve the interface contact between the bulged disk element 24 and the device and the spaced surface of the cap or cold plate, a coating 32 of a low melting alloy can be deposited on the surface of the bridge element. The coating is preferably Pb, in alloys of Sn, Cd, Bi and Pb-Sn mixture or other low melting alloy with a thickness in the range of 0.5 to 2 mils. In the assembly of the elements in the package, the elements 24 are located relative to the devices and the cover, and the assembly heated. During the heating, the thin coating is softened allowing it to intimately conform to the contacting surfaces. As indicated in FIGS. 1 and 3 the heating and melting of the coating 32 normally will result in fillets 25 and 27 between the device and element and the cover and element respectively. Alternately, a thin layer of thermal grease can be provided to achieve the same basic purpose.

Figure 4:
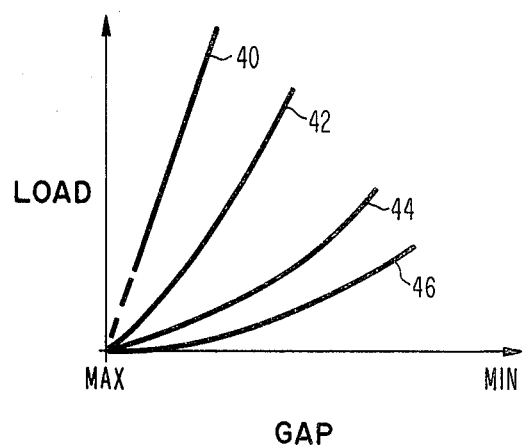
FIG. 4 is a plot of load imposed by a spring element versus the gap distance illustrating the relationship between the radial slot lengths.

Referring now to FIG. 4, there is illustrated the effect of providing and increasing the length of inwardly extending radial slots 28 on the loading of the device over a range of gap distances. The curve was obtained by selecting a number of thermal elements with varying lengths of inwardly extending radial slots, and also a disk with no slots. The various elements were tested by changing the gap distance and measuring the resultant force exerted by the disks. The disks were all the same diameter and thickness and of the same material with identical outwardly extending slots. Curve 40 indicates a disk element with no inwardly extending radial slots. Note that the load increases in almost direct proportion to the decrease in the gap. At the maximum gap, no force is exerted. The steep slope of the curve 40 indicates that the force increases rapidly to potential magnitudes that would be destructive on a device. Curves 42, 44 and 46 are disks with inwardly extending radial slots of varying length. Curve 42 indicates a disk with slots with lengths approximately 50% of the radial distance. Curve 44 indicates a disk with inwardly extending radial slots with lengths of approximately 70% of the radius. Curve 46 indicates a disk with radial slots with lengths approximately 85% of the radius. These curves indicate that inwardly extending slots make the element much more flexible and capable of accommodating for greater gap tolerances without materially reducing the thermal performance of the element.

Figure 5:
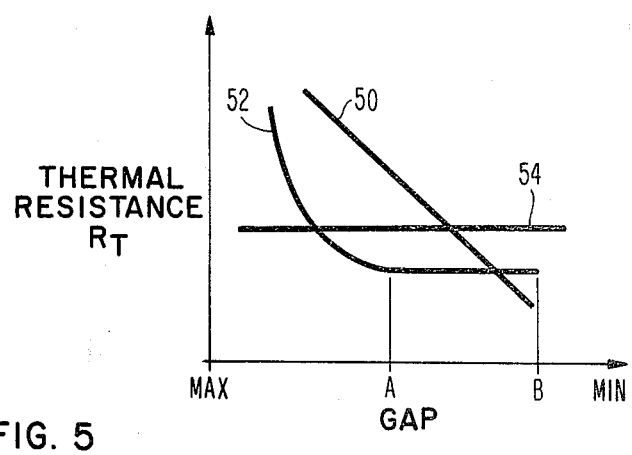
FIG. 5 is a plot of thermal resistance versus gap for different types of thermal elements.

FIG. 5 compares the thermal resistance of bulged disks with different shapes, defined by radiuses R1 and R2, and the use of thermal grease over different gap distances. Curve 50 represents the change of thermal resistance with gap distance for a thermal bridge application formed only of thermal grease. Curve 50 indicates that there is an almost direct linear increase in thermal resistance as the gap distance is increased. It also indicates that the thermal resistance change is relatively rapid as indicated by the slope of the line. Curve 52 is for a disk element where radiuses R1 and R2 are relatively large, i.e., approximately 100% of the diameter of the disk. The use of such large radiuses results in a relatively wide annular area of contact between the device and the element, and the cap and the element. Note that the thermal bridge element configuration is sensitive to pressure or loading, resulting from changing the gap. At the gap near the maximum, where the loading is low, the curve 52 has a relatively steep slope indicating a rapid change in thermal resistance with loading change. However, in the range indicated by A and B the thermal resistance is stabilized at a relatively low figure. Curve 54 is for a disk element where the shape as indicated by radiuses R1 and R2 are relatively small, i.e., approximately 40% of the diameter of the disk. The use of relatively small radiuses R1 and R2 results in a relatively narrow annular area of contact between the device and the element, and the cap and the element. Note that with the relatively narrow area of contact, the pressure or loading, resulting from changing the gap, does not materially effect the thermal resistance since the slope of the curve is essentially zero over the entire gap distance. However, the overall thermal resistance is higher than the flat portion of curve 52 between A and B.

In device cooling it is generally desireable that the thermal resistance be as low as possible. It is also desireable that the thermal resistance be constant. In fabrication of semiconductor packages, the gap tolerances will vary, due primarily to uncontrollable process and material variables. The thermal bridge element selected will preferably be capable of accommodating for these tolerances, provide a low resistance, and maintain a stable thermal resistance. If the gap tolerance is defined as the range indicated by A-B in FIG. 5, the thermal element with the shape defined by larger radiuses R1 and R2 is indicated by curve 52 is the best choice. However, if the tolerances exceed the distance indicated by A-B, the element should be redesigned using a different shape, defined by radiuses R1 and R2 to possibly obtain a compromise between the structure that produced curve 54. It is believed apparent that thermal elements capable of accommodating different process dimensions and conditions can be designed using the features of the thermal element of my invention.

While the invention has been illustrated and described with references to preferred embodiments thereof, it is to be understood that the invention is not limited to the precise construction herein disclosed and the right is reserved to all changes and modifications coming within the scope of the invention as defined in the appended claims.

I claim:

1. In a semiconductor package having a substrate, at least one semiconductor device mounted on said substrate, and a cold plate located over and in close proximity to the device, the improvement comprising
a thermal bridge element for conducting heat from said device to said cold plate, said thermal bridge element comprising
a bulged disk of resilient heat conductive material,
a first plurality of spaced radial slots emanating from a central opening and terminating short of the outside edge,
a second plurality of spaced radial slots located between said first plurality of radial slots in alternating relation extending inwardly from the outside edge, and terminating short of the center of said disk.

2. The thermal bridge element of claim 1 wherein said resilient heat conductive material is a metal selected from the group consisting of Cu, Ag, alloys whose major constituent is Cu, alloys of whose major constituent is Ag.

3. The thermal bridge element of claim 1 wherein said resilient heat conductive material is an alloy comprised essentially of 99.85% Cu and 0.15% zirconium.

4. The thermal bridge element of claim 1 which further includes a coating of a low melting point metal or metal alloy.

5. The thermal bridge element of claim 4 wherein said coating is a metal selected from the group consisting of Pb, In, and alloys of Pb, I that include Sn, Cd and B.

6. The therml bridge element of claim 5 wherein the thickness of said coating is in the range of 0.5 to 2 mils.

7. The thermal bridge element of claim 1 wherein said disk is circular in shape.

8. The thermal bridge element of claim 1 wherein said disk is a polygon.

9. The thermal bridge element of claim 1 wherein the thickness of said bulged disk is in the range of 4 to 18 mils.

10. The bridge element of claim 7 wherein the width of each slot of said first and second pluralities of slots is in the range of 4 to 18 mils.

11. The bridge element of claim 10 wherein the number of said first plurality of slots is in the range of 3 to 12, and the number of said second plurality of slots is in the range of 3 to 12.

12. The bridge element of claim 11 wherein there is provided 8 slots in each of said first and second plurality of slots.

13. The bridge element of claim 1 wherein the length of each slot in said first plurality of slots is in the range of 70 to 90% of the radius, and the length of each slot in said second plurality of slots is in the range of 80 to 95% of the length of the radius.

14. The bridge element of claim 1 wherein the bulged shape of said disk is defined by a cross-section having a curvature adjacent the outer edges with a radius in the range of 25 to 100% of the diameter of the disk, and a curvature adjacent the center portions opposite to the said curvature at the outer edges, with a radius in the range of 25 to 100% of the diameter of the disk.

15. The bridge element of claim 1 wherein the additive length of one of said first spaced radial slots when combined with the length of one of said second spaced radial slots being greater than the radius of said disk, said first and second slots arranged in interposing and alternating relation to impart axial flexibility to said disk.

* * * * *